United States Patent [19]

Johnson et al.

[11] 4,089,714
[45] May 16, 1978

[54] DOPING MERCURY CADMIUM TELLURIDE WITH ALUMINUM OR SILICON

[75] Inventors: Eric Shanks Johnson; Joseph Lawrence Schmit, both of Minnetonka, Minn.

[73] Assignee: Honeywell Inc., Minneapolis, Minn.

[21] Appl. No.: 757,269

[22] Filed: Jan. 6, 1977

[51] Int. Cl.² .......................................... H01L 21/225
[52] U.S. Cl. ..................................... 148/188; 148/1.5; 148/33
[58] Field of Search ...................... 75/134 H, 135, 139; 148/1.5, 33, 186, 187, 188, 189; 252/62.3 ZT; 357/11

[56] References Cited

U.S. PATENT DOCUMENTS

| | | | |
|---|---|---|---|
| 2,810,052 | 10/1957 | Bube et al. | 148/33 |
| 3,312,571 | 4/1967 | Ruehrwein | 148/175 |
| 3,740,690 | 6/1973 | Scharnhorst | 357/30 |
| 3,743,553 | 7/1973 | Scott et al. | 148/186 X |
| 3,767,471 | 10/1973 | Kasper et al. | 148/189 X |
| 3,884,788 | 5/1975 | Maciolek et al. | 204/192 |
| 3,949,223 | 4/1976 | Schmit et al. | 357/30 |
| 3,979,232 | 9/1976 | Hager et al. | 148/1.5 |
| 4,003,759 | 1/1977 | Koehler | 148/1.5 |

Primary Examiner—G. Ozaki
Attorney, Agent, or Firm—John S. Munday

[57] ABSTRACT

A method of adjusting the donor concentration in a body of mercury cadmium telluride, or in regions of a body, comprising the steps of contacting the donor material region with a donor material of either aluminum or silicon and heating the body at a temperature of at least 550° C for sufficient time to diffuse the donor material into the body. In a preferred embodiment, the heating is done in the presence of a source of mercury vapor pressure other than the body of semiconductor.

17 Claims, 7 Drawing Figures

HALL COEFFICIENT VERSUS INVERSE TEMPERATURE FOR Si-DIFFUSED AND STANDARD SAMPLES. BOTH SAMPLES WERE DIFFUSED AT 650°C FOR EIGHT DAYS FOLLOWED BY A SLOW COOL AT 30°C hr$^{-1}$. THE STANDARD WAS DIFFUSED WITH NO IMPURITY INTENTIONALLY ADDED TO THE AMPULE.

HALL COEFFICIENT VERSUS INVERSE TEMPERATURE FOR Al-DIFFUSED AND REFERENCE SAMPLES FROM NEAR THE SURFACE OF THE DIFFUSED MATERIAL. THE MATERIAL WAS DIFFUSED AT 650°C FOR SEVEN DAYS FOLLOWED BY A SLOW COOL AT 30°C hr$^{-1}$. THE REFERENCE WAS DIFFUSED WITH NO IMPURITY INTENTIONALLY ADDED TO THE AMPULE.

DOPING MERCURY CADMIUM TELLURIDE WITH ALUMINUM OR SILICON

ORIGIN OF THE INVENTION

This invention was made in the course of a contract with the Department of the Air Force.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g=1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about one to about 30 microns.

Mercury cadmium telluride photodiodes have found increasing use in recent years. With this increasing use, more sophisticated photodiodes such as (Hg,Cd)Te reachthrough avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development, (Hg,Cd)Te is of particular importance as a detector material for the important 8 to 14 micron atmospheric transmission "window". Extrinsic photoconductor detectors, noteably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al, *J. Phys. Chem. Solids*, 9, 325 (1959). Since that time extensive investigation of (Hg,Cd)Te detectors has been achieved for wavelengths from about one to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number of bulk growth techniques have been investigated. Zone melting methods for preparing (Hg,Cd)Te have been developed by B. E. Bartlett, et al, *J. Mater. Sci.*, 4, 266 (1966); E. Z. Dzuiba, *J. of Electrochem. Soc.*, 116, 104 (1969); and R. Ueda, et al, *J. Crystal Growth*, 13/14, 668 (1972). Still other bulk growth techniques for (Hg,Cd)Te have been described by J. Blair, et al, *Conference on Metallurgy of Elemental and Compound Semiconductors*, 12, 393 (1961) and J. C. Woolley, et al, *J. Phys. Chem. Solids*, 13, 151 (1960).

All of the bulk growth techniques requires additional post-growth processing steps to produce photodetectors. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley, et al. (U.S. Pat. No. 3,619,282), D. Carpenter, et al. (U.S. Pat. No. 3,619,283) and R. Lee, et al. (U.S. Pat. No. 3,642,529).

Another vapor phase expitaxial growth process has been studied by R. J. Hager, et al. (U.S. Pat. No. 3,725,135) and by G. Coehn-Solal, et al, Compt. Rend., 261, 931 (1965). This approach involves an evaporation--diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al, *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al, *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $InTe_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al, "Type Conversion and N-P Junction Formation in (Hg,Cd)Te Produced by Proton Bombardment", Appl. Phys. Let., 18, 321 (1971); McIngailis, et al, "Electron Radiation Damage and Annealing of (Hg,Cd)Te at Low Temperatures," J. Appl. Phys., 44, 2647 (1973); and Fiorito, et al, "Hg-Implanted (Hg,Cd)Te Infrared Low Photovoltaic Detectors in the 8 to 14 Micron Range", Appl. Phys. Let., 23, 448 (1973).

Another technique of forming N-type on P-type (Hg,Cd)Te is described by Marine, et al, "Infrared Photovoltaic Detectors from Ion-Implanted (Hg,Cd)Te", Appl. Phys. Let., 23, 450 (1973). This method involves aluminum ion implantation and subsequent anneal at 300° C for one hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293, now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that the donor concentrate of mercury cadmium telluride can be increased by the method of the present invention. Specifically, it has been discovered that donor materials selected from the group consisting of aluminum and silicon can be added to mercury cadmium telluride by contacting the body with a quantity of the donor material and heating the body at a temperature of at least 550° C for sufficient time to distribute the donor material within the body. Preferably, the heating step is carried out in the presence of a mercury vapor pressure derived from a source other than the body of mercury cadmium telluride.

The first step in the process of this invention, contacting the body of mercury cadmium telluride with the donor material, either aluminum or silicon, should be carried out in a manner designed to prevent contamination by other materials. In a preferred embodiment, the surface contamination potentially present on the body is removed, such as, for example, by etching. The surface layer is then sputter cleaned, preferably in an inert atmosphere such as argon followed immediately by a sputter deposition of a quantity of the donor material on the surface. Both aluminum and silicon are admirably suited to sputter deposition. Normal thicknesses of the deposited donor material will range from as low as 0.1 microns to as high as 1 or 2 microns, with approximately ½ micron being preferred. Sample temperatures less than 100° C are maintained during sputter cleaning and deposition.

As stated above, the heating step to effect diffusion of the donor materials is carried out in the presence of a mercury vapor pressure. Due to the high temperature of the heating step, it is desirable to prevent vaporization of the mercury in the mercury cadmium telluride body, so as to not drive the stoichiometric balance of the crystal beyond the existence region for HgCdTe.

As stated above, it is desirable to heat the body containing the donor material at a temperature of at least 550° C for sufficient time to distribute the donor material within the body. Care should always be taken to insure that the temperature does not reach the solidus temperature for that particular crystal, which varies, depending upon the value of $x$ of the particular crystal, but generally does not reach below about 700° C. A preferred range of temperature should be between approximately 625° and 675° C, with about 650° C being most preferred.

The body containing the donor material should be heated for a sufficient time to distribute the donor material within the body, thereby causing total diffusion of that quantity of donor material necessary to give a final concentration of from $10^{10}$ atoms per cubic centimeter to $10^{20}$ atoms per cubic centimeter. Normally, at least 24 hours will be necessary to accomplish this diffusion, with a preferred range of time being from 150 to 180 hours of heating.

One of the prime advantages of the present invention is the ability to form junctions of two different conductivity types in the same body of material while using the donor materials listed herein. Methods of introducing aluminum or silicon into mercury cadmium telluride crystals, such as bulk growth of the crystals after addition of the desired quantity of the donor material do not permit the adjustment of donor concentration in one part of a particular crystal without disturbing the concentration in the remaining parts. As is contemplated by the present invention, it is now possible to contact a first region of a mercury cadmium telluride crystal with the donor material described herein, followed by the heating step as above described, to create a donor rich region with respect to a second adjacent region which has not been contacted with the donor material. If, for example, the entire crystal was originally P-type, and sufficient donor material was added according to the present invention to render the region being treated N-type, a PN junction would be formed. Similarly, if the crystal is originally N-type, doping according to the present invention would render the treated region N+ type adjacent to the untreated N-type region.

BRIEF DESCRIPTION OF THE DRAWINGS

For a more complete understanding of the invention, reference is hereby made to the drawings, in which FIGS. 1–4 schematically represent the process of this invention.

DETAILED DESCRIPTION OF THE DRAWINGS

Figure 1:
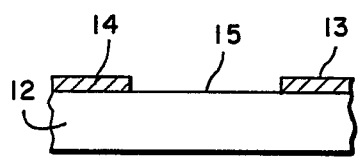

As shown in FIG. 1, a body 12 of mercury cadmium telluride is masked with masks 13 and 14 to leave a surface area 15. This surface area 15 is the selected side for addition of a donor material.

Figure 2:
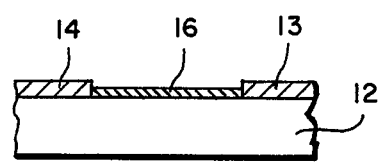

In FIG. 2, a quantity of donor material 16 is added to the surface of the body 12 of mercury cadmium telluride between the two masks 13 and 14. Normally, the surface may be etched to remove surface contaminations, followed by sputter cleaning to remove a surface layer. Immediately thereafter, a quantity of either aluminum or silicon may be sputtered onto the surface in a thickness from 0.1 microns to 2.0 microns, with a preferred amount being approximately 0.5 microns.

Figure 4:
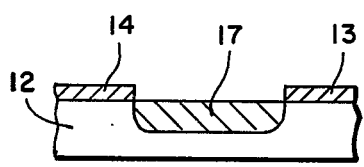
Figure 3:
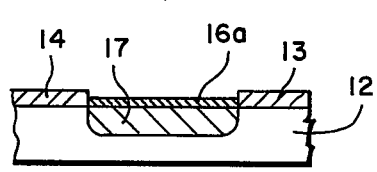

In FIG. 3, the body 12 has been subjected to a heating step of at least 550° C and preferably between 625° C and 657° C so as to distribute the donor material into a region 17 of the body 12 of semiconductor. Depending upon the amount of donor material present, the temperature and the time, various quantities will diffuse into the region 17. Those quantities of donor material remaining on the surface after the diffusion step 16a can be removed by conventional etching or other cleansing processes. Thus, as shown in FIG. 4, a body 12 of mercury cadmium telluride has a region 17 which is increased in donor material of either aluminum or silicon. If the body 12 was originally P-type material, and if sufficient aluminum or silicon has been distributed in the region 17, a PN junction has been formed. Similarly, if the body 12 was originally N-type, additional donors present in region 17 gives rise to an N-N+ junction.

Figure 5:
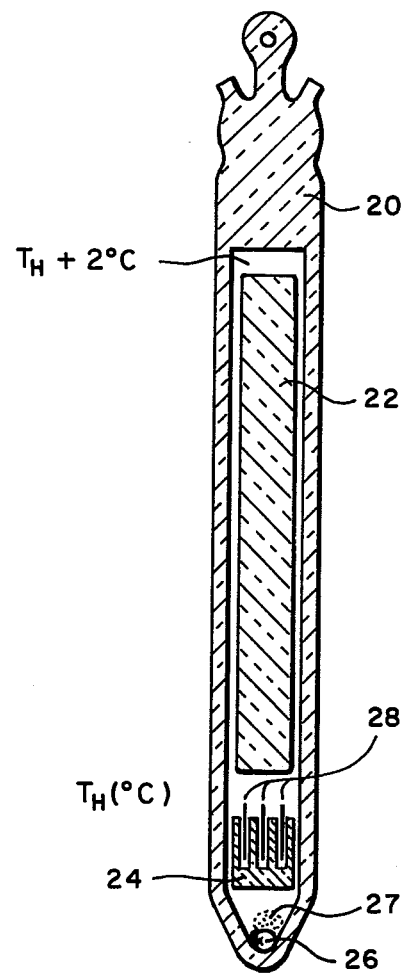
FIG. 5 is a sectioned view of an apparatus useful as one embodiment of the present invention.

In FIG. 5, a fused quartz ampule 20 is provided for use during the heating step of the present invention. A quartz plug 22 is inserted within the ampule to reduce the total volume. Similarly, a quartz sample rack 24 is mounted within the ampule to provide support for the various samples being treated according to the method of this invention. In the bottom of the ampule 20, a quantity of mercury is provided to give a source of mercury vapor pressure other than the body of mercury cadmium telluride being treated. It has been found that the stoichiometry of the samples being treated according to the present invention is maintained most advantageously by providing this extraneous source of mercury vapor pressure. As a further assurance that the stoichiometry of the crystals being treated is not disturbed during this heating process, it is another embodiment of this invention to include a quantity of mercury cadmium telluride 27 in the bottom portion of the ampule 20 as shown in FIG. 5. Samples 28 are then placed in the sample rack 24 for heating at a temperature $T_h$ according to the present invention. As stated above, the most preferred temperature is approximately 650° C although the range may be from as low as 550° C to as high as slightly below the solidus temperature. Again, to provide a stabilization of the stoichiometry, it is preferred to heat the upper portion of the ampule 20 to a slightly higher temperature, such as for example $T_h + 2°$ C. The ampule 20 is suspended in a furnace having suitable temperature control for a period of time sufficient to distribute the donor material within the body. Normally, as stated above, this time will normally take at least 24 hours, and preferably between 150 and 180 hours. However, much shorter times (or longer times) are possible. Unless stated otherwise, samples prepared according to the present invention and described hereinafter in the examples were heated for approximately one week or 168 hours at a temperature of approximately 650° C.

A number of experiments were performed to demonstrate the efficiencies of the present invention. In each case, an identical sample containing no impurities was processed under identical steps. This essential part of each experiment was done to distinguish the impurity effects from other changes produced by heat treatment or lattice damage. The standard sample was compared with the doped sample in each experiment and the results described herein show major variations between standard and doped samples.

Figure 6:
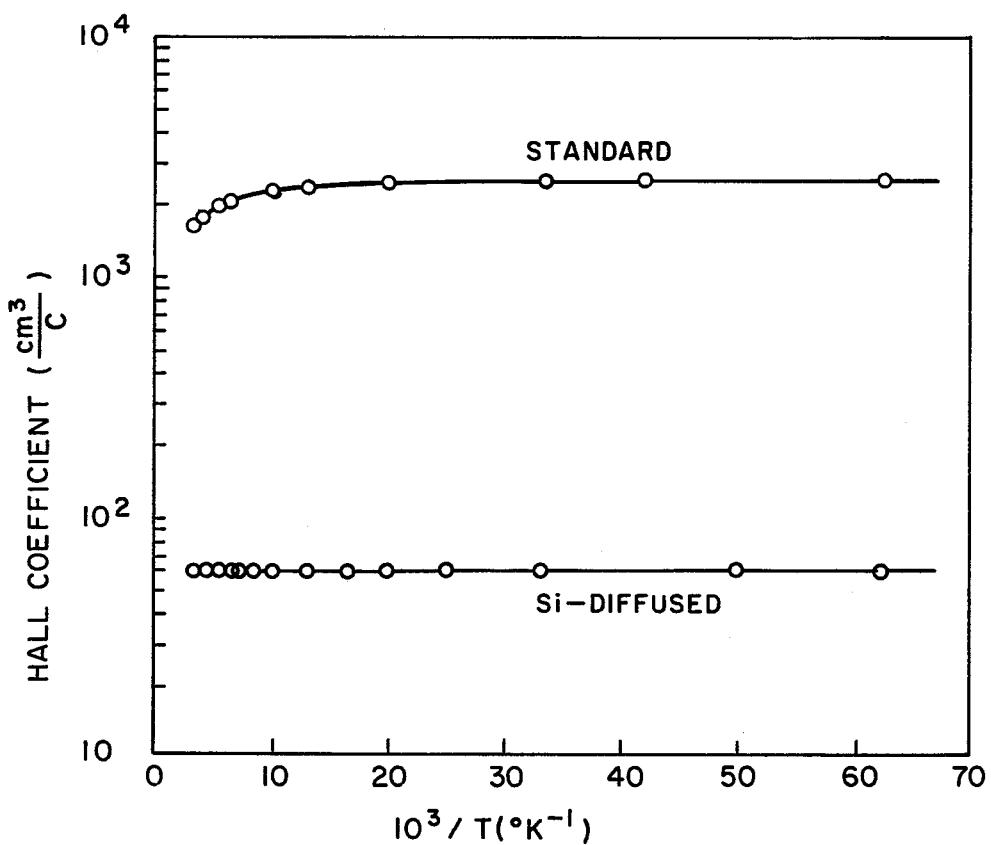
FIG. 6 and FIG. 7 show plots of the Hall coefficient versus the inverse of temperature for various materials.
Figure 7:
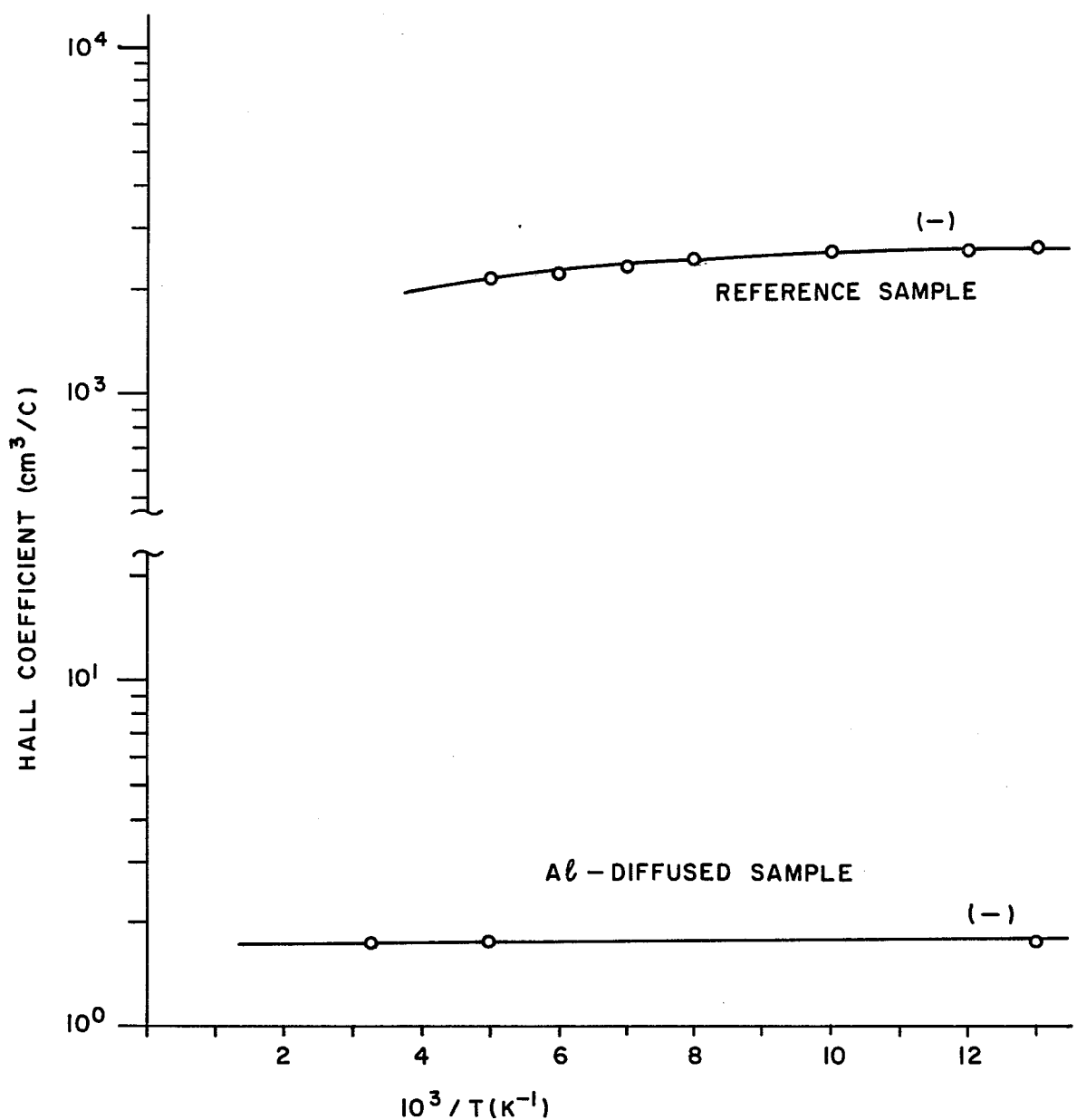

Presented below in the Table and in FIGS. 6 and 7 are the results of these experiments in whch P-type mercury cadmium telluride was treated with aluminum, silicon and no doping material according to the methods of this invention. Also shown in the Table are aluminum and silicon doped mercury cadmium telluride crystals heat treated at a temperature substantially below that which is required for practice of the present invention.

As can be seen from the Table, the samples in which aluminum or silicon was added and heat treated at a diffusion temperature of 650° C provided a satisfactory concentration of N-type material. Identical samples heat treated at a relatively low temperature and the samples in which no impurity was added, were unsuccessful in converting a region of the mercury cadmium telluride body to an N-type material.

TABLE i

| Semiconductor Body | Impurity Added | Diffusion Temperature (° C) | N-type Carrier Concentration (per cubic centimeter) |
|---|---|---|---|
| P-type mercury cadmium telluride | Aluminum | 290 | — |
| P-type mercury cadmium telluride | Aluminum | 650 | $3.6 \times 10^{18}$ |
| P-type mercury cadmium telluride | Silicon | 300 | — |
| P-type mercury cadmium telluride | Silicon | 650 | $1 \times 10^{17}$ |
| P-type mercury cadmium telluride | None | 650 | — |

Having described the invention, it will be readily apparent to those familiar with this art that many modifications of the process are possible. It should be therefore understood that the invention is not to be limited by the embodiments described but only by the scope of the following claims.

The embodiments of the invention in which an exclusive property or right is claimed are defined as follows:

1. A method of adjusting the donor concentration in a body of mercury cadmium telluride, comprising the steps of:
   contacting a body of mercury cadmium telluride with a quantity of donor material selected from the group consisting of aluminum and silicon; and
   heating said body at a temperature of at least 550° C for a sufficient time to distribute said donor material within said body.

2. The method of claim 1 which further includes the step of providing a mercury vapor pressure from a source other than said mercury cadmium telluride during said heating step.

3. The method of claim 1 wherein said quantity of donor material is sufficient to give a final concentration of from $10^{10}$ atoms per cubic centimeter to $10^{20}$ atoms per cubic centimeter.

4. The method of claim 1 wherein said donor material is aluminum.

5. The method of claim 1 wherein said donor material is silicon.

6. The method of claim 1 wherein said temperature ranges from 625° to 675° C for at least 24 hours.

7. The method of claim 6 wherein said heating is carried out for between 150 and 180 hours.

8. The method of claim 1 wherein said donor material is contacted on said body of mercury cadmium telluride by sputtering.

9. A method of increasing the donor concentration of a first region of mercury cadmium telluride with respect to a second adjacent region of mercury cadmium telluride comprising the steps of:
   contacting said first region with a donor material selected from the group consisting of aluminum and silicon; and
   heating said mercury cadmium telluride at a temperature of at least 550° C for a sufficient time to distribute said donor material within said region.

10. The method of claim 9 which further includes the step of providing a mercury vapor pressure from a source other than said mercury cadmium telluride during said heating step.

11. The method of claim 9 wherein said quantity of donor material is sufficient to give a final concentration of from $10^{10}$ atoms per cubic centimeter to $10^{20}$ atoms per cubic centimeter.

12. The method of claim 9 wherein said donor material is aluminum.

13. The method of claim 9 wherein said donor material is silicon.

14. The method of claim 9 wherein said temperature ranges from 625° to 675° C for at least 24 hours.

15. The method of claim 9 wherein said heating is carried out for between 150 and 180 hours.

16. The method of claim 9 wherein said second region is P-type and said quantity of donor material is sufficient to render said first region N-type, thereby forming a PN junction.

17. The method of claim 9 wherein said second region is N-type and said quantity of donor material is sufficient to render said first region $N^+$ type.

* * * * *